(12) United States Patent
Kononchuk

(10) Patent No.: US 7,939,387 B2
(45) Date of Patent: May 10, 2011

(54) PATTERNED THIN SOI

(75) Inventor: Oleg Kononchuk, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 80 days.

(21) Appl. No.: 12/280,639

(22) PCT Filed: Mar. 19, 2007

(86) PCT No.: PCT/IB2007/051435
§ 371 (c)(1),
(2), (4) Date: Aug. 25, 2008

(87) PCT Pub. No.: WO2008/114099
PCT Pub. Date: Sep. 25, 2008

(65) Prior Publication Data
US 2009/0032911 A1 Feb. 5, 2009

(51) Int. Cl.
H01L 21/84 (2006.01)
(52) U.S. Cl. .............. 438/152; 438/282; 257/E21.122
(58) Field of Classification Search .......... 438/152, 438/282
See application file for complete search history.

(56) References Cited

U.S. PATENT DOCUMENTS

| 5,691,231 | A | 11/1997 | Kobayashi et al. | 437/62 |
| 6,300,218 | B1 | 10/2001 | Cohen et al. | 438/423 |
| 6,846,727 | B2 | 1/2005 | Fogel et al. | 438/479 |
| 6,955,971 | B2 * | 10/2005 | Ghyselen et al. | 438/406 |
| 2005/0118789 | A1 | 6/2005 | Aga et al. | 438/459 |
| 2006/0051945 | A1 | 3/2006 | Yokokawa et al. | 438/526 |
| 2006/0154442 | A1 | 7/2006 | De Souza et al. | 438/455 |
| 2008/0102603 | A1 | 5/2008 | Kobayashi et al. | 438/459 |

FOREIGN PATENT DOCUMENTS

| FR | 2 847 007 | 5/2004 |
| JP | 2000/036445 | 2/2000 |
| JP | 2006/049725 | 2/2006 |

OTHER PUBLICATIONS

International Search Report and Written Opinion for PCT/IB2007/051435, 2007.
O. Kononchuk et al., *Internal Dissolution of Buried Oxide in SOI Wafers*, 2008, pp. 113-118, Solid State Phenomena, vols. 131-133, Trans Tech Publications, Switzerland.
J. Sullivan et al., *High Temperature Oxygen Out-Diffusion From the Interfacial SiOx Bond Layer in Direct Silicon Bonded (DSB) Substrates*, Oct. 2006, IEEE 2006 International SOI Conference, Niagara Falls, NY, Silicon Genesis Corp., California.
K.Y. Ahn et al., *Stability of Interfacial Oxide Layers During Silicon Wafer Bonding*, Jan. 15, 1989, pp. 561-563, J. Appl. Physics, No. 65, vol. 2 © 1988 American Institute of Physics.
A. Misiuk, XP004414254, *Effect of High Temperature—Pressure on SOI Structure*, Sep. 2002, pp. 155-161, Crystal Engineering, vol. 5, Nos. 3-4 © 2003 Elsevier Science Ltd., Barking, Great Britain.

* cited by examiner

*Primary Examiner* — Chandra Chaudhari
(74) *Attorney, Agent, or Firm* — Winston & Strawn LLP

(57) ABSTRACT

A process for treating a structure to prepare it for electronics or optoelectronics applications. The structure includes a bulk substrate, an oxide layer, and a semiconductor layer, and the process includes providing a masking to define on the semiconductor layer a desired pattern, and applying a thermal treatment for removing a controlled thickness of oxide in the regions of the oxide layer corresponding to the desired pattern to assist in preparing the structure.

19 Claims, 6 Drawing Sheets

PATTERNED THIN SOI

This application is a 371 filing of International Patent Application PCT/IB2007/051435 filed Mar. 19, 2007.

TECHNICAL FIELD

The invention concerns a process for fabricating Semiconductor on insulator structures (SeOI) with a patterned buried oxide layer. The method is directed to a semiconductor layer transfer on a receiving support followed by a masking step and a specific thermal treatment realized for selective dissolution of insulating regions inside the SeOI structure.

STATE OF THE ART

Mixed structures, i.e. structures comprising an alternation of bulk and isolated regions, appear to have an increasing interest. Indeed, the alternation of bulk and isolated regions inside the same structure leads to the fabrication of different components on the same wafer like for example:
  components on bulk regions, with an electric conductivity between the rear and front face of the wafer, for example vertical components.
  components on SOI (silicon on insulator) regions totally isolated from each other and isolated from the substrate; for example components MOS, systems MEMS, MOEMS.

FIG. 1 shows an example of such a mixed structure, where B refers to the bulk regions and SOI refers to the SOI regions.

Several techniques exist for the fabrication of mixed structures. The SIMOX process for example is realised via an oxygen implantation beneath the silicon wafer surface. A heat treatment at high temperature is applied to convert the implanted region into silicon dioxide. For the fabrication of mixed structures, the document U.S. Pat. No. 6,846,727 discloses the use of masks to locally implant ions into a substrate and create corresponding isolated layers.

Nevertheless, the final structure surface presents a bad uniformity due to the volume increase of the oxidized silicon.

Other processes for the fabrication of mixed structures use molecular bonding of a first substrate on which a local oxidation of the silicon has been made, with a second substrate. The document FR 2 847 077 discloses such a method. However, molecular bonding requires perfect surfaces without any defect. Therefore, specific cleanings of the surface are required before bonding using for example chemical mechanical planarization (CMP), thermal, plasma treatments and/or mechanical polishing.

Because of the presence of mixed areas, i.e. silicon and oxide areas, at the surface of the first substrate, polishing is a critical step.

Indeed, silicon and silicon dioxide are not polished in the same rate, with the same speed and it is difficult to obtain a good flatness for both materials on the same surface.

In particular, a dishing is observed after polishing, as shown on FIG. 2. This dishing can reach about 10 nanometers depending on the sizes of oxide and bulk regions, and leads to poor quality interfaces and low yields for the molecular bonding.

The document U.S. Pat. No. 5,691,231 discloses a method to obtain a better planarization of a mixed interface, and then improve the bonding. This method consists in the deposition of a polycrystal silicon layer on the surface after the formation of a region with oxide in the substrate. Indeed, the polycrystal silicon layer can be polished very finely in order to obtain an extremely even surface. Then the prepared substrate can be bonded with a second substrate and, because of the high quality of the interface, a good bonding is obtained. The other face of the second substrate is then etched and polished to obtain the desired thickness for the SOI.

However, improving the planarization of the mixed interface by this method requires an additional step in the process which is the deposition of said polycrystal silicon layer.

Another technique, disclosed in WO 2004/059711, consists in the bonding of two substrates by molecular adhesion, one of the substrates having some insulating regions. The method discloses the formation of impurities traps to obtain high quality interface. Such traps can be the insulating regions themselves and are disposed in such a way that a maximal distance exists between two successive insulating regions. These insulating regions trap and absorb the impurities which appear during thermal treatments used for strengthening the bonding interface. In this method, traps for impurities are used to obtain a high quality interface.

However, all existing methods are based on a layer transfer via molecular bonding on a substrate on which a mixed interface has been created, and they lead to an unsatisfactory bonding.

SUMMARY OF THE INVENTION

One goal of the invention is to create a mixed structure with a good uniformity of the structure surface. Another goal of the invention is to provide a process for fabrication a mixed structure without bonding mixed interfaces, in order to ensure a good quality bonding.

In order to reach these goals and to overcome the drawbacks of the prior art, the invention proposes, according to a first aspect, a process of treating a structure for electronics or optoelectronics, the structure comprising successively from its base to its surface a bulk substrate, an oxide layer and a semiconductor layer (10), characterized in that it comprises providing masking means to define on the semiconductor layer a desired pattern, and applying a thermal treatment for removing a controlled thickness of oxide in the regions of the oxide layer corresponding to said desired pattern.

Some other characteristics of this process of treating a structure are:
  said controlled thickness is the whole thickness of the oxide layer, for at least some of said regions, or for all said regions corresponding to the desired pattern;
  the regions of the semiconductor layer corresponding to said desired pattern have a controlled thickness;
  said controlled thickness of the regions of the semiconductor layer corresponding to the desired pattern is advantageously comprised between 250 and 5000 angstroms, preferably between 250 and 1000 angstroms;
  the masking means are a mask covering the semiconductor layer according to a pattern complementary to said desired pattern;
  said mask is formed by thermal oxidation of the semiconductor layer, or by nitride or oxide deposition on the semiconductor layer;
  the masking means are formed by masking regions of the semiconductor layer which are thicker than the regions of the semiconductor layer corresponding to said desired pattern;
  said masking regions are advantageously at least 1.5 time thicker than the regions of the semiconductor layer corresponding to said desired pattern;
  the thermal treatment is performed in an inert or reducing atmosphere with a controlled temperature and a controlled duration, wherein said controlled thickness of the regions of the semiconductor layer, said controlled temperature and duration are selected for dissolving a controlled thickness of oxide in the regions of the oxide layer corresponding to said desired pattern;

the controlled temperature is preferably between 1100 and 1300° C. and the controlled duration is between 5 minutes and 5 hours;

said controlled thickness of the regions of the semiconductor layer and said controlled temperature are selected for having a mean reduction rate of the oxide layer of at least 0.5 angstroms per minute;

the thickness of the oxide layer before the thermal treatment is comprised between 100 and 1000 angstroms.

In a second aspect, the invention proposes a process of manufacturing a structure for electronics or optoelectronics, the structure comprising successively from its base to its surface a bulk layer, an oxide layer and a semiconductor layer, characterized in that it comprises the following steps:

(a) providing a semiconductor layer;
(b) bonding the semiconductor layer with a bulk substrate such that an oxide layer is formed at the bonding interface, for forming a structure comprising successively the said substrate, oxide layer and semiconductor layer;
(c) providing masking means to define a desired pattern on the semiconductor layer;
(d) applying a thermal treatment for removing a controlled thickness of oxide in the regions of the oxide layer corresponding to said desired pattern.

Some other characteristics of this process of manufacturing a structure are:

said controlled thickness is the whole thickness of the oxide layer, for at least some of said regions, or for all said regions corresponding to the desired pattern;

the regions of the semiconductor layer corresponding to said desired pattern have a controlled thickness;

said controlled thickness of the regions of the semiconductor layer corresponding to the desired pattern is advantageously comprised between 250 and 5000 angstroms, preferably between 250 and 1000 angstroms;

step (c) comprises the formation of a mask on the semiconductor layer according to a pattern complementary to said desired pattern;

step (c) comprises etching the semiconductor layer according to said desired pattern, for forming masking regions which are thicker than the regions corresponding to said desired pattern.

said masking regions are preferably at least 1.5 time thicker than the regions corresponding to said desired pattern;

the thermal treatment is performed in an inert or reducing atmosphere with a controlled temperature and a controlled duration, wherein said controlled thickness of the regions of the semiconductor layer corresponding to said desired pattern, said controlled temperature and duration are selected for dissolving a controlled thickness of oxide in the regions of the oxide layer corresponding to said desired pattern;

said controlled temperature is between 1100 and 1300° C. and said controlled duration is between 5 minutes and 5 hours;

the oxide layer before the thermal treatment is comprised between 100 and 1000 angstroms.

In a third aspect, the invention proposes a structure for electronics or optoelectronics comprising successively a bulk substrate, an oxide layer and a semiconductor layer, characterized in that the oxide layer comprises regions whose thickness is selectively controlled.

Some other characteristics of the structure are:

the oxide layer comprises regions having a first thickness and regions having a second lower thickness;

the oxide layer comprises regions without oxide.

the thickness of the semiconductor layer is advantageously comprised between 250 and 5000 angstroms, preferably between 250 and 1000 angstroms.

the thickness of the oxide layer is comprised between 100 and 1000 angstroms.

BRIEF DESCRIPTION OF THE FIGURES

Other characteristics, objects, and advantages of the invention will appear clearer in reading the description below, which is illustrated by the following figures.

DETAILED DESCRIPTION OF THE INVENTION

The invention discloses a process of treating a standard SOI structure in order to fabricate a mixed structure. The process consists in providing masking means on the surface of the semiconductor layer to define a desired pattern and in applying a thermal treatment to remove selectively desired regions of the oxide layer.

"Define a desired pattern" means in this text that the masking means are located on the surface of the semiconductor layer, only on determined areas of the surface, thus leaving free some areas, whose surface represents said desired pattern. In other words, the masking means cover the surface of the semiconductor layer only in areas whose surface represents a pattern complementary to the desired pattern.

The word "area" means in this text a portion of the surface of the semiconductor layer (i.e. a 2D surface), whereas the word "region" refers to a portion of a layer.

"Regions" means in this text, regions across the surface of the oxide layer (respectively the semiconductor layer). In other words, referring to FIG. 3, in a coordinate system (x, y, z) associated to the structure, if the oxide layer (respectively the semiconductor layer) is seen as a 3D volume, with x and y referring to the "horizontal" plane (plane into which the oxide (respectively semiconductor) layer lies) and z referring to the "vertical" direction (direction of the thickness of the layer), the regions are defined by x and y coordinates.

The desired regions are the regions of the oxide layer corresponding to the desired pattern. In this text, "corresponding" means that the desired regions of the oxide layer and the regions defined by the pattern on the semiconductor layer are located face-to-face in parallel planes. In other words, the desired regions are located at the same position in the plane (x, y), i.e. they have the same x and y coordinates as the regions on the semiconductor layer defined by the desired pattern; and they have the same surface as the surface of the regions defined by the desired pattern. The desired regions of the oxide layer can thus be described as the projection of the desired pattern on the oxide layer, in a direction perpendicular to the surface of the structure.

When referring to the semiconductor layer, the regions of the semiconductor layer corresponding to the desired pattern are the regions of the semiconductor layer which are free from masking means.

The method is described with SOI initial structures realized by the Smart Cut™ technology, but other structures like SIMOX, BESOI, Eltran® structures can also be used.

Figure 1:
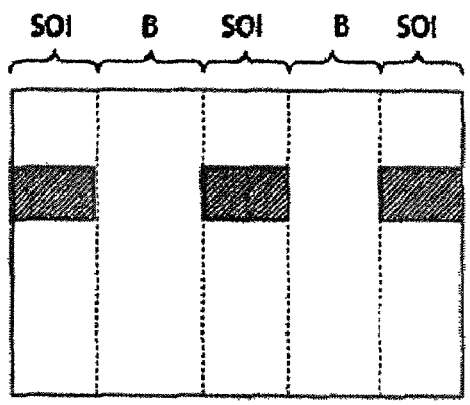
FIG. 1 shows a mixed structure comprising bulk and SOI regions.
Figure 2:
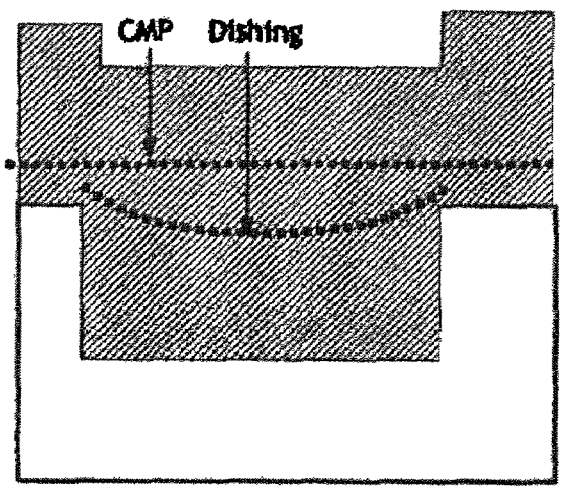
FIG. 2 shows the phenomenon of dishing occurring while polishing substrates with mixed regions.
Figure 3:
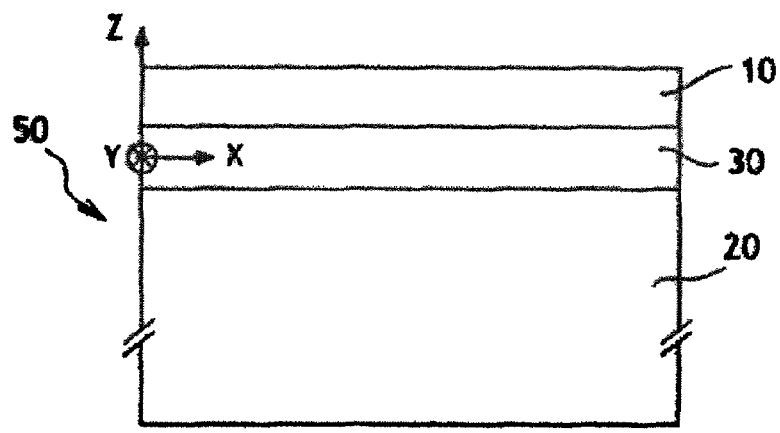
FIG. 3 shows a schematic cross-section view of a SOI structure on which the treatment according to the invention is applied.

Referring to FIG. 3, a SOI initial structure 50 on which the treatment according to the invention will be performed, is shown.

The structure 50 comprises a bulk substrate 20, an oxide layer 30 and a semiconductor layer 10.

The bulk substrate 20 stiffens the whole structure 50. To this aim, it has a sufficient thickness, typically of hundreds of micrometers. The bulk substrate 20 is formed of a single bulk material, like Si, Ge, SiC, GeC, GaN, sapphire, glass, quartz, or other materials. Alternatively, the bulk substrate is formed of at least two materials, stacked one onto the other.

The semiconductor layer 10 is of at least one semiconductor material. The semiconductor layer 10 may be of Si, or SiGe. The semiconductor layer 10 may alternatively be of a combination or a superposition of at least two of these materials and/or a superposition of several sub-layers.

The semiconductor material is monocrystalline, polycrystalline or amorphous. It may be doped or non-doped, porous or non-porous.

The semiconductor layer 10 is advantageously adapted for receiving electronic or optoelectronic components.

The semiconductor layer 10 is advantageously thin. Its thickness is advantageously less than about 5000 angstroms, and in particular less than 2500 angstroms. For example, the semiconductor layer 10 may have a thickness between around 250 angstroms and 2500 angstroms, or between around 250 angstroms and 1000 angstroms.

The said oxide layer 30 is buried in the structure 50, located between the bulk substrate 20 and the semiconductor layer 10.

Figure 4A:
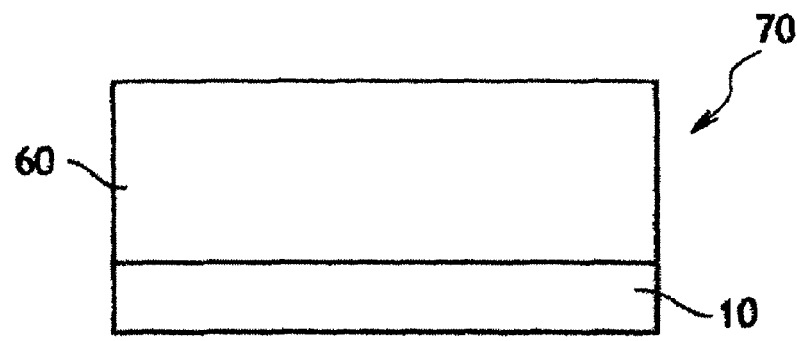
FIGS. 4A to 4C show the different steps of a process of manufacturing said SOI structure.
Figure 4B:
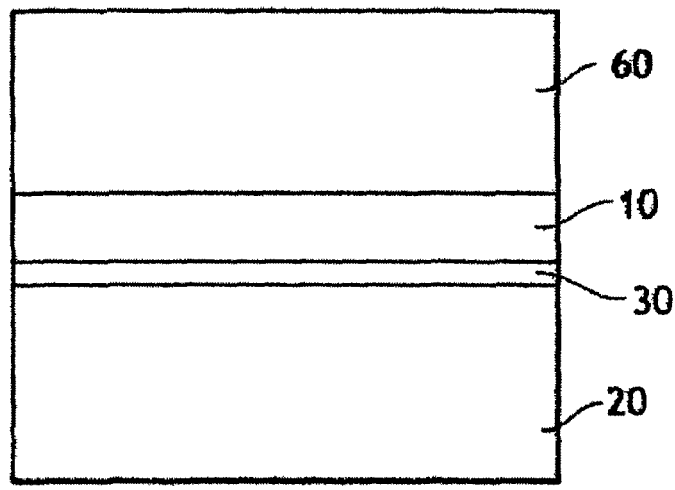
Figure 4C:
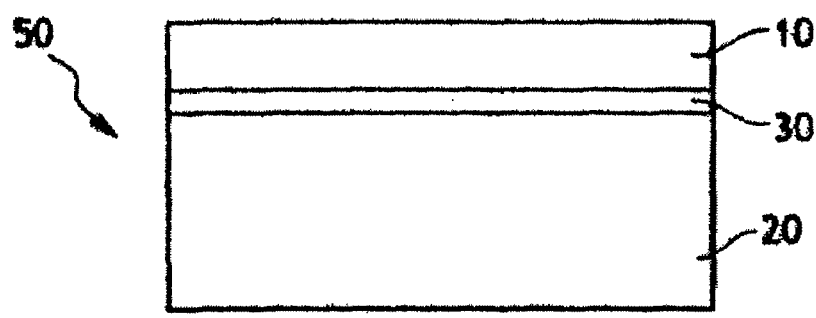

The manufacturing of this structure 50 can be done by a wafer bonding technique, as illustrated on FIGS. 4A, 4B and 4C.

Especially, the manufacturing can be firstly implemented by providing a wafer 70 with the semiconductor layer 10 therein, the semiconductor layer 10 lying at the surface of the wafer 70 defining a front layer on a rear portion 60 of the wafer 70.

The wafer 70 may be of a single bulk material, the semiconductor layer 10 being then in the bulk material or grown on it. Alternatively, the wafer 70 may be a composite wafer comprising a holder substrate and a multilayer structure (not shown). In particular, the wafer 70 can include a buffer structure between the holder substrate and the semiconductor layer 10 arranged for adapting the lattice parameter between these two elements and/or for confining defaults. For example, the wafer 70 comprises a Si holder substrate, a SiGe buffer layer with a Ge concentration continuously increasing in thickness from the holder, and a SiGe or Ge and/or a strained Si semiconductor layer 10 over it.

Advantageously, the semiconductor layer 10 has been epitaxially grown. Crystalline growth of the epitaxial layer may have been obtained using the known techniques of LPD, CVD and MBE (respectively low power deposition, chemical vapour deposition, and molecular beam epitaxy).

A next step consists of bonding the wafer 70 to the bulk substrate 20 such that the semiconductor layer 10 is adjacent to the bonding interface.

Advantageously, the bonding is firstly implemented by well-known bonding techniques (see, for example, "Semiconductor Wafer Bonding Science and Technology" by Q.-Y. Tong and U. Gösele—a Wiley Interscience publication, Johnson Wiley & Sons, Inc—for more details). Thus, for example, molecular bonding of hydrophilic surfaces or surfaces rendered hydrophilic may be done. Well-known cleaning steps may be implemented just before bonding.

Optionally, a plasma treatment of one and/or the other of the two surfaces to be bonded, is performed.

Before bonding, the oxide layer 30 was formed on the semiconductor layer 10 and possibly on the substrate 20, for being buried at the bonding interface after bonding.

In one embodiment, this oxide layer 30 is only formed by a natural oxidation of the semiconductor layer 10 surface and possibly of the substrate 20 surface, for forming a native oxide layer.

This natural oxidation may lead to the formation of oxide precipitates and islands on the semiconductor layer 10 surface.

For example, if the semiconductor layer 10 is of Si or SiGe, Si atoms at the surface and oxygen atoms in atmosphere or in water molecules react together for forming a $SiO_2$ native layer 20 at the surface. If the substrate 20 comprises silicon at surface, it is also covered by a native $SiO_2$ ultra-thin layer.

This natural oxidation is not avoided due particularly to the need of water molecules on the surfaces of the elements to bond (substrate 20 and semiconductor layer 10) for performing a hydrophilic bonding.

The thickness of the buried native oxide layer 30 may vary from about 10 to about 50 angstroms depending on surface treatment used before bonding.

In a second embodiment, this oxide layer 30 is additionally formed by specific means on the semiconductor layer and/or on the substrate 20.

The purpose of this oxide formation is to provide a dielectric layer with a predetermined thickness for manufacturing, after bonding, a semiconductor-on-insulator (SeOI) structure, the insulator of this structure being the oxide layer 30.

The oxide layer 30 may be formed by oxidation of the semiconductor layer 10 and/or of the substrate 20.

For example, if the semiconductor layer 10 is of Si or SiGe, $SiO_2$ layer 20 may be formed at the surface by oxidation. If the substrate 20 comprises silicon at surface, a $SiO_2$ layer may also be formed by thermal oxidation Alternatively, the oxide layer 30 may be formed by deposition of aggregates constituted of the oxide material. For example, $SiO_2$ aggregates may be deposited.

The parameters of the formation of the oxide are controlled such that the oxide layer 30 has a predetermined thickness for being a dielectric barrier between the semiconductor layer 10 and the substrate 20.

Advantageously, the oxide layer 30 is thin or ultra-thin. For example, the oxide layer 30 has a thickness, after bonding, between around 50 angstroms and around 1000 angstroms, preferably between 100 and 250 angstroms.

Referring to FIG. 4B, the substrate 20 and the wafer 70 are bonded together such that the oxide layer 30 is located at the interface, as previously explained.

Optionally, at least one step of heating is additionally implemented for reinforcing the bonds at the interface.

Referring to FIG. 4C, the thickness of the wafer 70 is then reduced such that the whole rear portion 60 is removed. Only the semiconductor layer 10 is kept.

Any technique of wafer reduction may be used, such as chemical etching technique, lapping then polishing, Smart Cut® technology which is known per se to the skilled person (see for example <<Silicon-On-Insulator Technology: Materials to VLSI, 2nd Edition >> from Jean-Pierre Colinge in <<Kluwer Academic Publishers>>, p. 50 et 51), taken alone or in combination.

In particular, if using the Smart Cut® technology, the wafer 70 is implanted prior to bonding, with atomic species (such as hydrogen, helium or a combination of the two, and/or other atomic species) at energy and dose selected to produce therein a zone of weakness at a depth close to the thickness of the semiconductor layer 10. The implantation may be carried out before or after forming the thin oxide layer 30. Finally, once the bonding has been carried out, Smart Cut® technology comprises supplying suitable energy (like thermal and/or mechanical energy) for rupturing the bonds at the zone of weakness, and thus detaching the rear portion 60 from the semiconductor layer 10.

An optional step of finishing (by polishing, CMP, cleaning, thermal treatments . . . ) may be implemented after the reduction step, in order to have a smooth and homogeneous semiconductor layer 10. This finishing step may be implemented prior to or after the heat treatment described below.

Other steps may also be provided, with no limitation according to the invention.

The obtained SOI structure 50 thus comprises successively from its base to its surface the bulk substrate 20, the oxide layer 30 and the semiconductor layer 10.

The process according to the invention implies applying a thermal treatment (that will be described in detail below) to selectively remove desired regions of the oxide layer 30 inside the structure, wherein said desired regions are corresponding to a desired pattern.

In a preferred embodiment, the thermal treatment consists in dissolving the oxide layer 30 in said desired regions.

To this aim, the thermal treatment makes the oxygen of the oxide layer 30 diffuse and evaporate through the semiconductor layer 10, so that the thickness of the oxide layer 30 decreases until the oxide is completely removed.

As will be explained below, the thickness of the semiconductor layer 10 has an influence on the diffusion and evaporation of oxygen. The thinner the layer is, the faster the dissolution rate is. Therefore the thickness of the semiconductor layer 10 is advantageously comprised between 250 and 5000 angstroms, preferably 1000 angstroms.

On the contrary, if the semiconductor layer is thick, in particular thicker than 2500 angstroms, or if it is covered by a layer of another material, the diffusion and evaporation of the oxygen would occur but much slower.

To ensure the selectivity of the dissolution of the oxide layer 30, masking means are thus provided in order to prevent the diffusion and the evaporation of the oxygen from the regions of the semiconductor layer corresponding to a pattern complementary to the desired pattern.

Figure 8A:
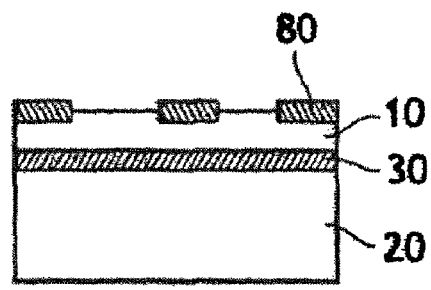
FIGS. 8A to 8D show the different steps of a process of treating the structure according to a first embodiment.

Referring to FIG. 8A, in a first embodiment, the semiconductor 10 has a controlled thickness comprised between 250 and 5000 angstroms, and the masking means are a mask 80 that covers the semiconductor layer 10 according to a pattern complementary to said desired pattern and leaving free the regions 12 corresponding to the desired pattern. The mask 80 advantageously prevents the diffusion and evaporation of the oxygen from the regions 11 of the semiconductor layer 10 covered by the mask having at least a thickness higher than 100 to 500 angstroms.

Figure 10A:
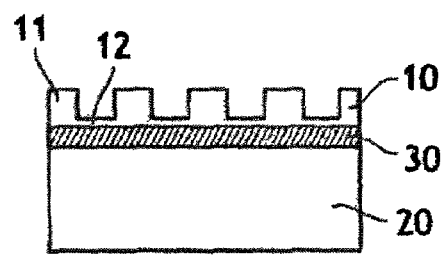
FIGS. 10A to 10C show the different steps of a process of treating the structure according to a third embodiment.

Alternatively, referring to FIG. 10A, the masking means are the semiconductor layer itself, wherein a thick semiconductor layer has been etched in order to form thin regions 12 corresponding to said desired pattern.

The thicker masking regions 11 are thick enough to prevent or limit the diffusion and the evaporation of the oxygen through these regions, and thus the diffusion and the evaporation of the oxygen mainly occurs in the thin regions 12.

Typically, the thickness ratio between the thick and the thin regions is higher than 1.5, preferably higher than 2.

Therefore the diffusion of oxygen mainly occurs on the patterned free parts of the structure (i.e. parts without mask, or parts of the semiconductor layer with an appropriate thickness), and thus the dissolution of the oxide layer occurs according to the same desired pattern.

The heat treatment processed for dissolving the oxide layer 30 in desired regions will now be described.

The heat treatment is implemented in an inert or reducing atmosphere, like argon or hydrogen atmosphere or a mixture of them.

The heat treatment is processed such that in the desired regions the oxide layer 30 reduces in thickness, by oxygen diffusion through the semiconductor layer 10.

Figure 5:
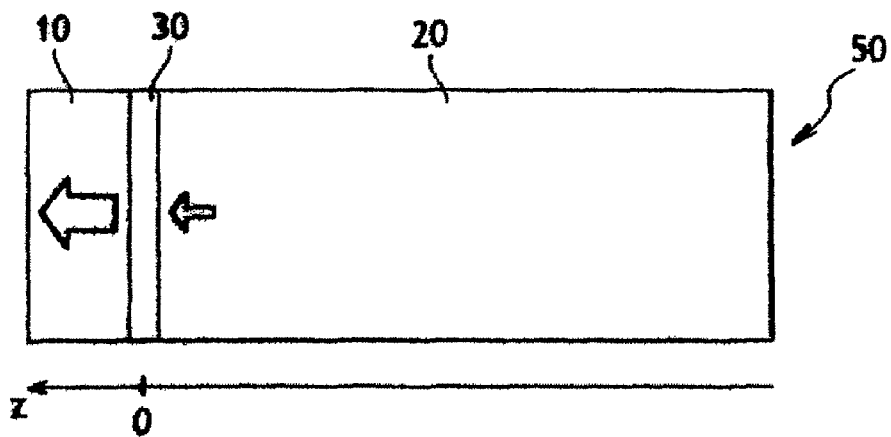
FIGS. 5 and 6 are schematic cross-section views of the SOI structure, illustrating the diffusion phenomena.
Figure 6:
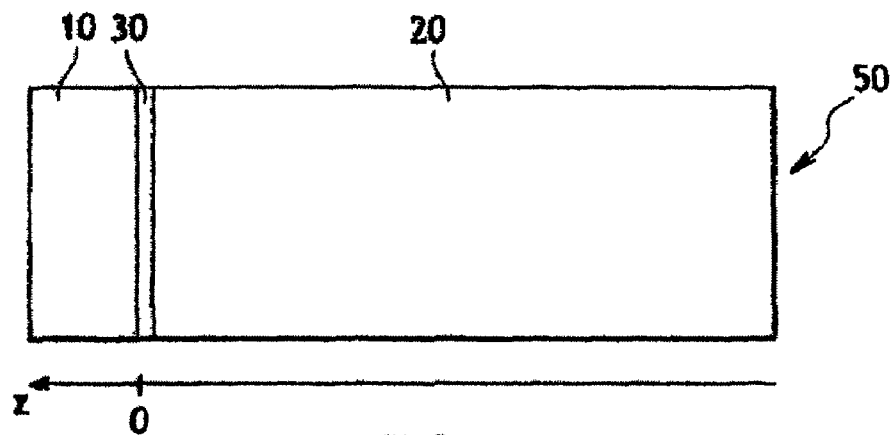
Figure 7:
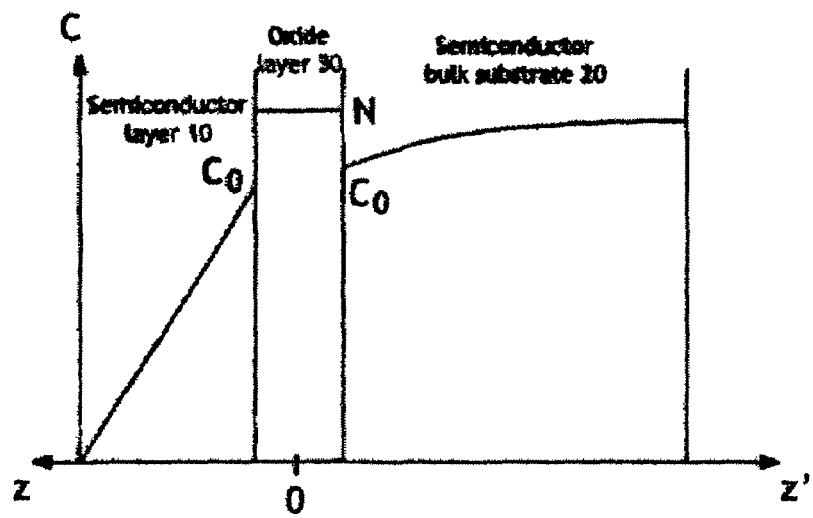
FIG. 7 is a graph showing distribution of oxygen inside the said SOI structure after a partial dissolution of the oxide layer.

For illustrating the reduction of the oxide layer 30 due to oxygen diffusion, FIGS. 5 and 6 show respectively a cross sectional view of the structure 50, one during diffusion and the other after diffusion.

The structure 50 contains two diffusion domains:
left side (top semiconductor layer 10) and
right side (bulk substrate 20) separated by the oxide layer 30 with a thickness $d_{ox}$.

It is assumed that the diffusion of oxygen is in one dimension—the diffusion equation is then:

$$\frac{\partial C(z,t)}{\partial t} = D(T)\frac{\partial^2 C(z,t)}{\partial z^2}$$

where: z-axis extends transversally to the layer planes, has its origin at the center of the oxide layer 30, and is pointed to the positive value in the semiconductor layer 10, and to the negative value in the bulk substrate 20.

C(z, t) is the oxygen concentration at time t and at z.

D(T) is the diffusion coefficient of the oxygen in the semiconductor (unit: cm$^2$/s).

FIG. 6 schematically shows distribution of oxygen in the structure after a heat treatment.

Oxide dissolution rate is the difference between the left oxygen flux through the semiconductor layer 10 (large arrow on FIG. 5) and the right oxygen flux in the bulk substrate 20 (small arrow on FIG. 5) at the oxide interfaces.

If the top semiconductor layer 10 is sufficiently thin, some oxygen of the oxide layer 30 diffuses through it and evaporates in the atmosphere at the surface of it.

This diffusion is accelerated by the fact that the atmosphere is chosen inert, as it can be deduced from the boundary conditions.

In particular, the following reaction occurs at the surface of the semiconductor layer 10 if the inert atmosphere contains hydrogen and the layer is in silicon:

$$SiO_2 + H_2 \rightarrow H_2O + SiO\uparrow$$

If the inert atmosphere contains Argon, the reaction is:

$$Si + O \rightarrow SiO \uparrow$$

For increasing the efficiency of this diffusion, a previous deoxidation of the surface of the semiconductor layer 10 may be done.

As the bulk substrate 20 is very thick, the oxygen of the oxide layer 30 can not reach the free surface of the bulk substrate 20.

However, some isolated oxygen that can be present in the bulk substrate 20 diffuse from the bulk substrate 20 to the oxide layer 30.

Accordingly, there is a competition between the left diffusion and the right diffusion, as:
- left flux is greater than the right flux (large arrow in FIG. 5), and results in the oxide layer 30 dissolution;
- right flux is greater than the left flux (small arrow in FIG. 5), and results in the oxide layer 30 growth.

The applicant noticed that, if the semiconductor layer 10 is sufficiently thin and the atmosphere is inert:
- at the very first moment of the heat treatment, the thickness of the oxide layer 30 increases (the right diffusion from the bulk substrate 20 is greater than the left diffusion through the semiconductor layer 10),
- then, after typically a few seconds, oxide dissolution begins (the right diffusion from the bulk substrate 20 is less than the left diffusion through the semiconductor layer 10).

For example, the applicant noticed that, for a Si layer 10 having a thickness of about 1000 angstroms and for a temperature of about 1100° C., the oxide dissolution begins at about 10 seconds.

Then, after a determined time and if the thickness of the semiconductor layer 10 is small compare to the oxygen diffusion length $(D*t)^{1/2}$, the applicant calculated that left diffusion determines approximately the whole resulting flux from oxide. The right diffusion is then insignificant from this determined time. In this last case, the determined time is about 100 s, at about 1200° C.

In such conditions the steady flux is defined as:

$$F = D(T) * C_0(T)/d_{Se}$$

where: $d_{Se}$ is the thickness of the semiconductor layer 10
where $C_0(T)$ is the equilibrium oxygen solubility in the semiconductor at annealing temperature.

Oxide dissolution time for decreasing the oxide layer 30 thickness $d_{ox}$ by a controlled value $\Delta d_{ox}$, is:

$$time = \frac{d_{Se} * \Delta d_{ox}}{D(T) * C(T)} * N$$

where: N is the concentration of oxygen atoms in oxide.

For example, if the semiconductor layer 10 is of monocrystalline Si then N=4.22e22, and the oxide layer 30 is of $SiO_2$, and if $d_{Se}$=1000 angstroms and $\Delta d_{ox}$=20 angstroms:

time=1.86e−12*exp(4.04 eV/kT)

The applicant demonstrated that the main parameter affecting the time is the anneal temperature and the thickness of the top semiconductor layer 10.

Furthermore, the result does not depend on oxygen concentration in bulk substrate 20.

For examples, and based on numerical simulation, the minimum annealing conditions to dissolve 20 angstroms of interfacial $SiO_2$, with 1000 angstroms of top Si layer, in a Ar or H2 atmosphere, are:

1 100° C. for 2 hr, or
1 200° C. for 10 min, or
1 250° C. for 4 min.

The temperature and the duration of the heat treatment are then selected for inciting the oxygen of the oxide layer 30 to diffuse through the semiconductor layer 10 rather than in the bulk substrate 20.

Then, the thickness of the oxide layer 30 decreases and the oxide can be removed completely in desired regions.

Additionally, the thickness of the semiconductor layer 10 may also have been selected, when forming it, for inciting the said diffusion.

Particularly, the thickness of the semiconductor layer 10 and the temperature of the heat treatment determine the mean reduction rate of the oxide layer 30. More the thickness less the rate. More the temperature more the rate.

For example, said thickness and temperature may be controlled such that at least about 0.5 angstroms per minute of oxide layer 30 mean reduction rate is reached. To this purpose, for a temperature of about 1200° C., a thickness of a Si monocrystalline layer 10 is chosen less than 2500 angstroms.

Only the duration of the heat treatment is then necessary to control for accurately removing a controlled thickness oxide from the oxide layer 10.

Alternatively, the thickness of the semiconductor layer 10 has been selected for removing a controlled thickness of oxide by implementing the heat treatment with a controlled duration and a controlled temperature.

The controlled temperature may be selected about 1100° C.-1300° C., and especially around 1100° C. or 1200° C.

The thickness of the semiconductor layer 10 may between around 250 angstroms and around 1000 angstroms, the controlled temperature is about 1200° C. and the controlled duration is between around 5 minutes and 5 hours.

Three particular embodiments of the invention will now be described.

In a first embodiment, referring to FIGS. 8A to 8D, a standard SOI structure 50 is prepared in order to have an oxide layer 30 thin or ultra-thin, i.e. with a thickness comprised between 100 and 1000 angstroms, preferably from 250 to 500 angstroms, and a thin semiconductor layer 10, i.e. with a thickness comprised between 250 and 5000 angstroms, preferably between 250 and 1000 angstroms.

Then, referring to FIG. 8A, a mask 80 is formed by thermal oxidation at the surface of the semiconductor layer 10 of the structure 50, the mask 80 covering only determined regions 11 of the semiconductor layer 10, thus leaving free regions 12 corresponding to a desired pattern.

Figure 8B:
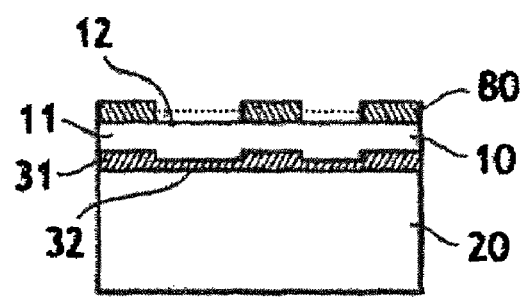
Figure 8C:
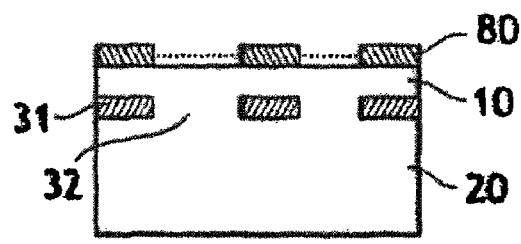

A next step, shown on FIGS. 8B and 8C, is a thermal treatment at 1200° C. during 2 hours, that leads to the dissolution of the buried oxide layer 30 in the regions corresponding to the regions 12 of the semiconductor layer which are not covered by the mask 80. FIG. 8B shows the intermediate structure during the thermal treatment. The thickness of the oxide layer begins to decrease from the top of the oxide layer, thus forming regions 32 with a lower thickness than the other regions 31 of the oxide layer that are protected by the mask 80. FIG. 8C shows the structure after the complete dissolution of the oxide layer in the regions 32 corresponding to the desired pattern.

Figure 8D:
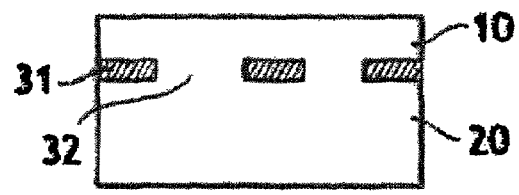

Then, referring to FIG. 8D, a finishing step, comprising for example thinning or CMP, is performed in order to remove the mask 80 and to obtain a good uniformity and a desired roughness to ensure the quality of the components that will be further built on it.

In this embodiment, where the mask 80 is formed by thermal oxidation, the semiconductor layer 10 is consumed over several angstroms, preferably from 30 to 200 angstroms. The difference of thickness in comparison to the unmasked regions is compensated by the silicon and/or oxygen evaporation occurring during the thermal treatment applied for the oxide dissolution.

In a second embodiment, referring to FIGS. 9A to 9D, a standard SOI structure 50 is prepared in order to have an oxide layer 30 thin or ultra-thin, i.e. with a thickness comprised between 100 and 1000 angstroms, preferably from 250 to 500 angstroms.

Figure 9A:
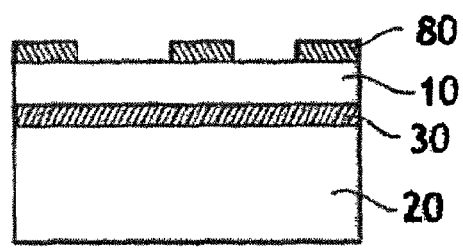
FIGS. 9A to 9D show the different steps of a process of treating the structure according to a second embodiment.

Then, referring to FIG. 9A, a mask 80 is formed by nitride or oxide deposition on the surface of the thin semiconductor layer 10.

Figure 9B:
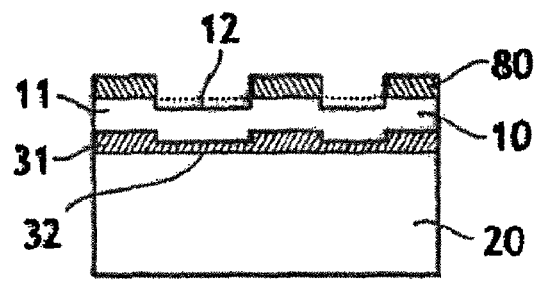
Figure 9C:
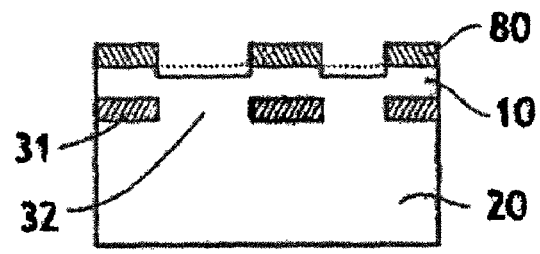
Figure 9D:

A next step, shown on FIGS. 9B and 9C, is a thermal treatment at 1200° C. during 3 hours to dissolve locally the buried oxide layer 30.

In this embodiment, the deposition of the mask 80 does not consume thickness of the semiconductor layer 10. Therefore during the selective dissolution of the buried oxide layer, a small dishing of the semiconductor layer occurs on the surfaces without any mask. The difference of level in comparison with the regions protected by the mask is reduced or eliminated during the finishing step, with CMP for example.

Figure 10B:
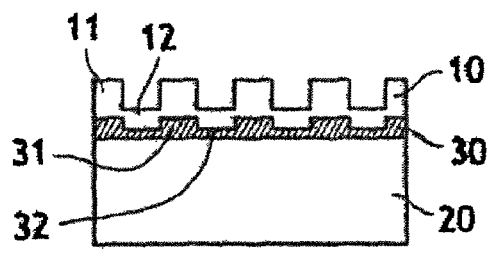
Figure 10C:
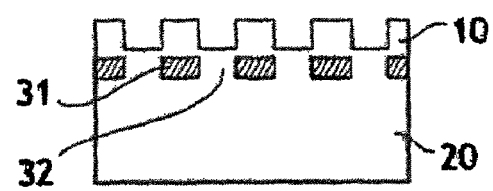

In a third embodiment, referring to FIGS. 10A to 10C, a SOI structure is formed with an oxide layer 30 having a thickness comprised between 200 and 500 angstroms.

The semiconductor layer 10 is selectively etched in order to have a thickness comprised between 250 and 1000 angstroms in the regions 12 corresponding to a desired pattern, and thicker masking regions 11 elsewhere. The masking regions 11 of the semiconductor layer are thick enough, at least 2500 angstroms, to prevent oxygen to diffuse through them and thus play the same role as the mask 80 in the previous embodiments.

Then a thermal treatment at 1200° C. during 1 to 3 hours is applied to dissolve the oxide in the regions 32 of the oxide layer 30 corresponding to the desired pattern. A finishing step (not shown), comprising thinning or CMP, leads to a good quality surface.

The mixed structure according to the invention is thus a SOI structure, comprising from its base to its surface a bulk structure, a patterned oxide layer, a semiconductor layer. The patterned oxide layer means that the oxide layer extends, in a plane parallel to the surface of the structure, according to a desired pattern. The complementary pattern is formed by the material of the bulk structure. The thickness of the oxide layer is comprised between 100 and 1000 angstroms, preferably between 250 and 500 angstroms, whereas the thickness of the semiconductor layer is comprised between 250 and 5000 angstroms, preferably between 250 and 1000 angstroms.

The mixed structure according to the invention can also be described as a structure comprising an alternation of bulk and SOI regions, said bulk and SOI regions defining respectively a desired pattern and a complementary pattern in a plane parallel to the surface of the structure.

The thickness of the bulk regions is the thickness of the whole structure; the bulk regions are formed by a semiconductor material.

The SOI regions comprise from their base to their surface:
 a bulk substrate,
 an oxide layer whose thickness is comprised between 100 and 1000 angstroms, preferably between 250 and 500 angstroms,
 a semiconductor layer whose thickness is comprised between 250 and 5000 angstroms, preferably between 250 and 1000 angstroms.

In the embodiments described above, the thermal treatment is performed until the oxide is completely dissolved in desired regions, in order to form a mixed structure with bulk and SOI regions.

Figure 11:
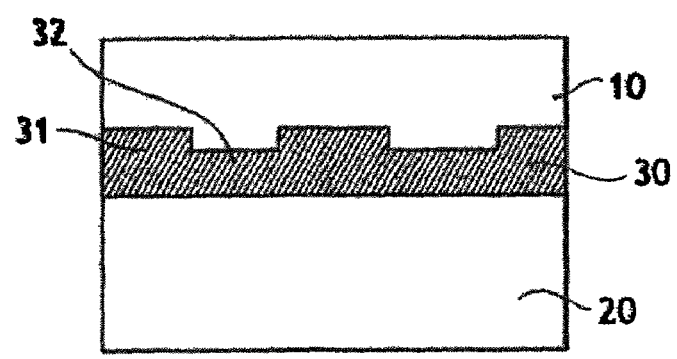
FIG. 11 shows another embodiment of the structure that can be obtained by the process of treating.

However, it would also be possible to stop the thermal treatment before the complete dissolution of the oxide (at intermediate steps shown on FIGS. 8B, 9B, 10B), in order to keep regions of different oxide thickness. This allows the fabrication of a structure shown on FIG. 11, in which the oxide layer comprises regions 31 with a first thickness and regions 32 with a second lower thickness. Indeed, the thermal treatment can be used for removing a controlled thickness of oxide in the desired regions.

For example, if the oxide dissolution rate is fixed, only the duration of the thermal treatment has to be adapted in order to remove a controlled thickness of oxide.

Another possibility is to use different masking means, in order to control selectively the thickness of different regions of the oxide layer. For example, it would be possible to manufacture a structure with an oxide layer comprising regions with the initial thickness, thinner regions and regions without oxide. To do this, a process in 2 or more steps shall be used. In a first step, a first mask is formed on the semiconductor layer, defining a first pattern. Then a first thermal treatment is applied to remove a controlled thickness of oxide in the regions corresponding to the first pattern. In a second step, a second mask is formed on a portion of the first pattern, thus defining a second pattern included in the first pattern. Then a second thermal treatment is applied, in order to remove completely the oxide in the regions corresponding to the second pattern. But the second mask prevents the dissolution of the oxide in the regions that had been thinned during the first thermal treatment and that are now covered by the mask. The structure thus obtained comprises regions with the initial thickness (in the regions covered by the first mask), regions with a lower thickness (in the regions covered by the second mask) and regions without oxide (in the regions corresponding to the second pattern).

This embodiment thus allows the fabrication of SOI structures with a buried oxide layer of different thicknesses; such SOI structures are very interesting for applications such as memories.

An advantage of the process according to the invention is that it is applied on a standard SOI structure which is of good quality because it has been manufactured using bonding techniques that give good results. The process according to the invention does not imply polishing of mixed regions and therefore avoids problems linked with polishing, in particular dishing.

Besides, the buried oxide layer can be formed either by thermal oxidation or by oxide deposition.

Furthermore, the silicon top layer can have a different crystalline orientation or different doping from silicon regions. The bonding interface is close to the surface. It is possible to integrate a n+ doped layer on n− silicon. In such disposition, some components can be realized without modification of the doping during the fabrication process; an example of application is the fabrication of diodes.

The silicon regions have advantageously high crystalline quality and the components can be built directly on these parts of the silicon. Moreover, the transferred silicon layer can have high crystalline quality silicon on which components can directly be formed.

Besides, the silicon transferred layer can have different crystalline orientations, according to the HOT technique (Hybrid Orientation Technology).

What is claimed is:

1. A process of treating a semiconductor structure for electronics or optoelectronics, the semiconductor structure comprising successively a bulk substrate, an oxide layer, and a semiconductor layer, wherein the process comprises providing a masking on the semiconductor layer to define a desired pattern, with the masking formed by providing masking regions of the semiconductor layer which are thicker than the regions of the semiconductor layer corresponding to the desired pattern, and applying a thermal treatment for removing a controlled thickness of oxide in regions corresponding to the desired pattern of the masking.

2. The process according to claim 1, wherein the controlled thickness to be removed in at least some of the regions is the whole thickness of the oxide layer.

3. The process according to claim 1, wherein the controlled thickness to be removed in all regions is the whole thickness of the oxide layer.

4. The process according to claim 1, wherein the regions of the semiconductor layer corresponding to the regions of the desired pattern have a controlled thickness of between 250 and 5000 angstroms.

5. The process according to claim 4, wherein the regions of the semiconductor layer corresponding to the regions of the desired pattern have a controlled thickness of less than 1000 angstroms.

6. The process according to claim 1, wherein the masking is a mask covering the semiconductor layer according to a pattern that is complementary to the desired pattern.

7. The process according to claim 5, wherein the mask is formed by thermal oxidation of the semiconductor layer.

8. The process according to claim 5, wherein the mask is formed by depositing a nitride or oxide on the semiconductor layer.

9. The process according to claim 1, wherein the masking regions are at least 1.5 times thicker than the regions of the semiconductor layer corresponding to the desired pattern.

10. The process according to claim 1, wherein the thermal treatment is performed in an inert or reducing atmosphere with a controlled temperature and a controlled duration, wherein the controlled thickness of the regions of the semiconductor layer, the controlled temperature and controlled duration are selected for dissolving a controlled thickness of oxide in the regions of the oxide layer corresponding to the desired pattern at a desired mean reduction rate.

11. The process according to claim 10, wherein the oxide layer has a thickness of between 100 and 1000 angstroms before the thermal treatment, and wherein the controlled temperature is between 1100 and 1300° C. and the controlled duration is between 5 minutes and 5 hours with the mean reduction rate of the oxide layer being at least 0.5 angstroms per minute.

12. The process according to claim 1, wherein the semiconductor structure is provided by bonding the semiconductor layer to the bulk substrate such that an oxide layer is formed at the bonding interface therebetween.

13. The process according to claim 12, which further comprises etching the semiconductor layer according to the desired pattern for forming masking regions which are thicker than regions corresponding to the desired pattern.

14. The process according to claim 13, wherein the masking regions are at least 1.5 times thicker than the regions corresponding to the desired pattern.

15. The method according to claim 1, which produces a semiconductor structure for electronics or optoelectronics which structure includes an oxide layer having regions of different thicknesses.

16. The method according to claim 15, wherein the oxide layer of the semiconductor structure comprises first regions of a first thickness and second regions having a second thickness that is lower than the first thickness.

17. The method according to claim 15, wherein the oxide layer of the semiconductor structure comprises regions without oxide.

18. The method according to claim 15, wherein the semiconductor layer of the semiconductor structure has a thickness of between 250 but less than 5000 angstroms.

19. The method according to claim 15, wherein the oxide layer of the semiconductor structure has a thickness of between 100 and 1000 angstroms.

* * * * *